United States Patent
O'Connell

(10) Patent No.: US 9,674,597 B1
(45) Date of Patent: Jun. 6, 2017

(54) ELECTRICAL CIRCUIT BOARD WITH EMBEDDED ACOUSTIC CHANNEL

(71) Applicant: Bose Corporation, Framingham, MA (US)

(72) Inventor: Michael O'Connell, Northborough, MA (US)

(73) Assignee: BOSE CORPORATION, Framingham, MA (US)

(*) Notice: Subject to any disclaimer, the term of this patent is extended or adjusted under 35 U.S.C. 154(b) by 0 days.

(21) Appl. No.: 15/040,465

(22) Filed: Feb. 10, 2016

(51) Int. Cl.
H04R 1/02 (2006.01)
H04R 1/10 (2006.01)
H05K 1/02 (2006.01)

(52) U.S. Cl.
CPC ......... *H04R 1/1016* (2013.01); *H04R 1/1091* (2013.01); *H05K 1/028* (2013.01); *H05K 1/0298* (2013.01); *H05K 2201/09009* (2013.01)

(58) Field of Classification Search
CPC .... H04R 1/1016; H04R 1/1091; H05K 1/028; H05K 1/0298; H05K 2201/09009
USPC ................................................. 381/174, 175
See application file for complete search history.

(56) References Cited

U.S. PATENT DOCUMENTS

| 5,434,362 | A  | * | 7/1995  | Klosowiak | H05K 1/028 439/77 |
| 6,668,064 | B1 | * | 12/2003 | Lin | H04R 1/1016 381/328 |
| 7,480,435 | B2 | * | 1/2009  | Brist | H05K 1/024 385/129 |
| 9,197,961 | B2 |   | 11/2015 | Chang et al. | |
| 9,247,335 | B2 |   | 1/2016  | Taylor et al. | |
| 2010/0080405 | A1 | * | 4/2010 | Wu | H04R 1/2838 381/174 |
| 2015/0358708 | A1 | * | 12/2015 | Axelsson | H04R 1/08 381/71.7 |

* cited by examiner

*Primary Examiner* — Brian Ensey
(74) *Attorney, Agent, or Firm* — Schmeiser, Olsen & Watts LLP; William G. Guerin

(57) ABSTRACT

An electrical circuit board assembly that can be used in a headphone includes acoustic elements incorporated into a rigid or flexible circuit board. The electrical circuit board assembly permits the convenient routing of electrical circuitry and acoustic elements, such as an acoustic port, between acoustic chambers in the headphone. The acoustic port includes a channel embedded in in the circuit board. Control of the dimensions of the channel is achieved using conventional circuit board assembly techniques. Advantageously, the circuit board assembly enables convenient and repeatable assembly into headphones, such as earbuds, and results in more consistent acoustic performance from the headphones.

18 Claims, 6 Drawing Sheets

SECTION A-A

SECTION A-A

SECTION B-B

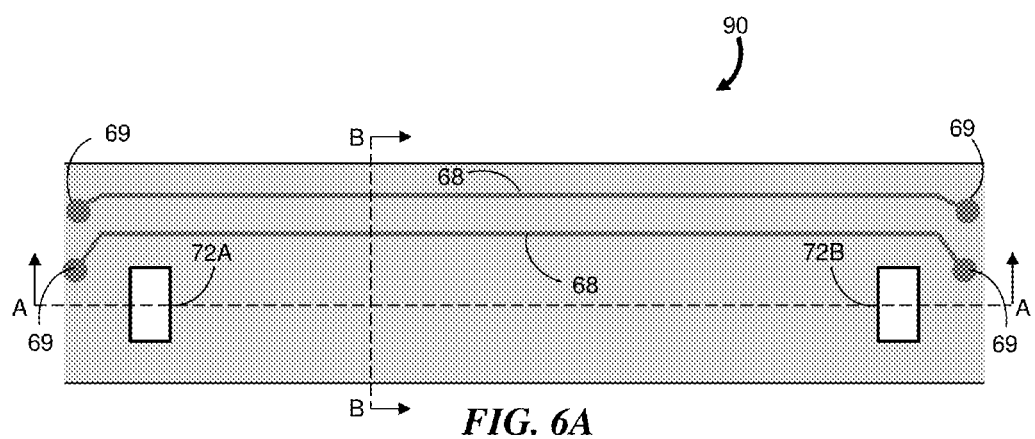
FIG. 6A
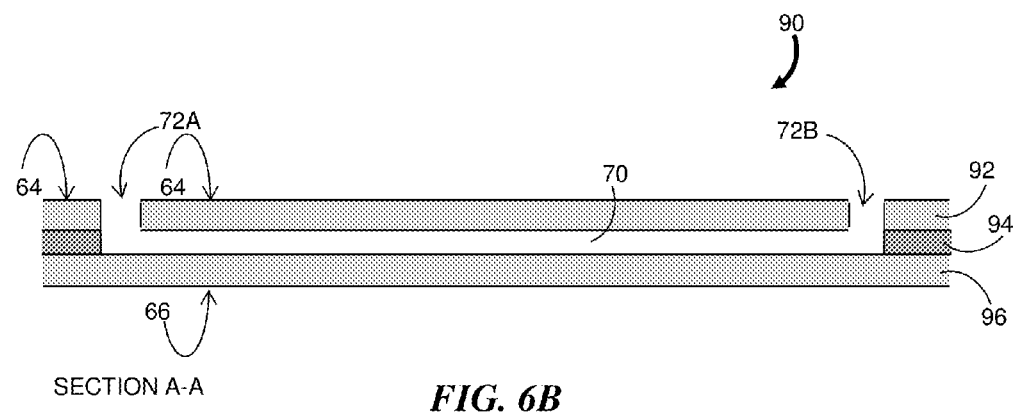
SECTION A-A  FIG. 6B
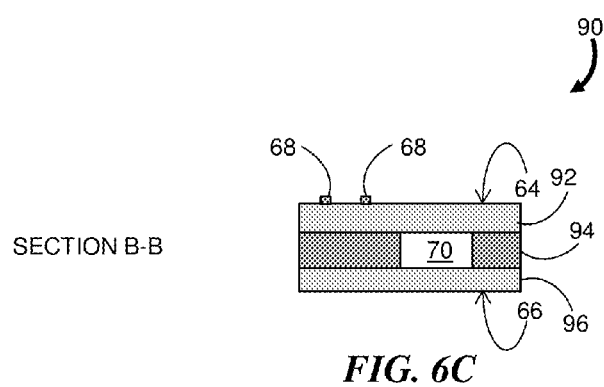
SECTION B-B  FIG. 6C

ELECTRICAL CIRCUIT BOARD WITH EMBEDDED ACOUSTIC CHANNEL

BACKGROUND

This description relates generally to an electrical circuit board having an embedded acoustic channel and, more specifically, to a flexible electrical circuit board having an embedded acoustic channel and integrated acoustic elements.

SUMMARY

In one aspect, an electrical circuit board includes a dielectric substrate having an upper surface, a lower surface and a channel disposed between the upper and lower surfaces. The dielectric substrate has a first aperture and a second aperture each extending into a thickness of the substrate from one of the upper and lower surfaces. The channel has a length extending from the first aperture to the second aperture. The channel and the first and second apertures define an acoustic channel that extends substantially along a length within the dielectric substrate.

Examples may include one or more of the following features:

The dielectric substrate may include an upper layer, a lower layer and an intermediate layer disposed between the upper and lower layers. The channel is formed in the intermediate layer. A first adhesive layer may be disposed between the upper layer and the intermediate layer, and a second adhesive layer may be disposed between the intermediate layer and the lower layer. The intermediate layer may include a pair of intermediate layer surfaces where an electrical trace is formed on at least one of the intermediate layer surfaces. At least one of the upper layer, the lower layer and the intermediate layer is at least one of a metallic layer, a bonding sheet, a stiffener layer and an adhesive layer. The dielectric substrate may include a plurality of intermediate layers with the channel being formed in at least two of the intermediate layers. The channel formed in at least two of the intermediate layers may have a generally elliptical cross-section.

The dielectric substrate may include a first layer adjacent to a second layer, with the channel disposed along a surface of the first layer that is adjacent to a surface of the second layer. One of the first and second layers may be a metallic layer, a bonding sheet, an insulating layer and a stiffener layer. An adhesive layer may be disposed between the first and second layers.

At least one electrical trace may be formed on at least one of the upper surface and the lower surface of the dielectric substrate. The dielectric substrate may be a flexible dielectric substrate or a rigid dielectric substrate. The channel may have a square cross-section.

In accordance with another aspect, a headphone includes an earbud body, an acoustic element and a dielectric substrate. The earbud body has an internal volume that includes a first acoustic chamber and a second acoustic chamber. The acoustic element is disposed in the internal volume between the first and second acoustic chambers. The dielectric substrate is disposed in the internal volume and has a length extending from a first end in the first acoustic chamber to a second end in the second acoustic chamber. The dielectric substrate includes an upper surface, a lower surface and a channel disposed between the upper and lower surfaces. The dielectric substrate has a first aperture and a second aperture each extending into a thickness of the substrate from one of the upper and lower surfaces. The channel extends from a first channel end at the first aperture to a second channel end at the second aperture. The channel and the first and second apertures define an acoustic channel between the first and second acoustic chambers.

Examples may include one or more of the following features:

The dielectric substrate may be a flexible dielectric substrate or a rigid dielectric substrate. The channel may have a square cross-section.

The dielectric substrate may include an upper layer, a lower layer and an intermediate layer disposed between the upper and lower layers, wherein the channel is formed in the intermediate layer. A first adhesive layer may be disposed between the upper layer and the intermediate layer, and a second adhesive layer may be disposed between the intermediate layer and the lower layer. At least one of the upper layer, the lower layer and the intermediate layer may be at least one of a metallic layer, a bonding sheet, a stiffener layer and an adhesive layer. There may be a plurality of intermediate layers and the channel may be formed in two or more of the intermediate layers. The channel formed in the intermediate layers may have a generally elliptical cross-section.

The dielectric substrate may include a first layer adjacent to a second layer with the channel disposed along a surface of the first layer that is adjacent to a surface of the second layer. An adhesive layer may be disposed between the first and second layers. One of the first and second layers may be one of a metallic layer, a bonding sheet, an insulating layer and a stiffener layer.

BRIEF DESCRIPTION OF THE DRAWINGS

The above and further advantages of examples of the present inventive concepts may be better understood by referring to the following description in conjunction with the accompanying drawings, in which like numerals indicate like structural elements and features in various figures. The drawings are not necessarily to scale, emphasis instead being placed upon illustrating the principles of features and implementations.

FIGS. 6A, 6B and 6C are illustrations of a top view, cross-sectional side view and cross-sectional end view, respectively, of yet another example of an electrical circuit board having an acoustic channel.

DETAILED DESCRIPTION

Figure 1:
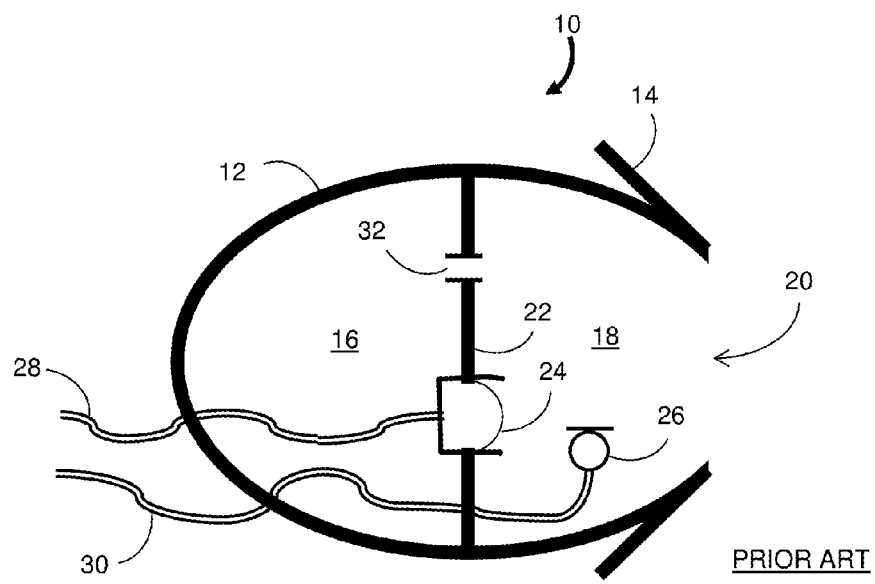
FIG. 1 is a cross-sectional illustration of an example of a conventional feedback-based acoustic noise reduction earbud.

The terminology used herein is for the purpose of describing particular examples and implementations only and is not intended to be limiting. All terms used herein have the same meaning as commonly understood by one of ordinary skill in the art unless defined otherwise herein.

The term "body" refers generally to an object or structure. The body may include features to allow one or more components to be disposed inside the body (e.g., embedded within the body or disposed in a body cavity or chamber), on the surface of the body, or attached to the body using fasteners or connectors, or through one or more intervening structures.

As used herein, a "dielectric substrate" means a substrate formed of at least one layer of a dielectric material. A dielectric substrate may include one or more additional layers of materials that are not dielectrics, such as electrically conductive layers, bonding sheets, electrically insulating layers and adhesive layers.

An "electrical circuit board" refers to a flexible or rigid structure having one or more sheets or layers of a dielectric or insulating material. The electrical circuit board includes one or more electrically conductive pathways, or "traces," on at least one surface and/or within the structure. A multi-layer electrical circuit board includes layers fixed together to form a laminate. The electrical circuit board may include one or more electrical components mounted to or formed on or in the circuit board structure and is sometimes referred to as a circuit board assembly.

The term "earbud" refers to an earphone that is at least partially insertable into an ear. Earbuds also include canalphones and similar devices.

Earbuds may include acoustic chambers, or acoustic cavities, linked by tuned acoustic elements acting as acoustic masses and/or acoustic resistances. The acoustic chambers typically include electrical wiring that connects to microphones, speakers and other sensors located inside the earbud. The wiring may pass through one or more walls of the earbud body that define or separate the acoustic chambers. In many instances, the physical dimensions of the acoustic elements are less than one millimeter. Consequently, repeatable fabrication of the acoustic elements and the assembled earbud is often challenging, especially when the elements are molded as plastic earbud parts. High static pressure can develop within a sealed acoustic chamber. To prevent the occurrence of high static pressure and to allow for proper acoustic tuning, an acoustic port of small cross-sectional dimension is often provided inside the earbud body. Inclusion of the acoustic port can be challenging due to limitations in fabrication processes.

Various implementations described below allow for the acoustic elements in an earbud to be incorporated into a rigid or flexible circuit board assembly to create a single structure that permits the routing of electrical circuitry and acoustic elements, such as an acoustic port, between acoustic chambers. Advantageously, the dimensional control of the acoustic port is determined primarily by circuit board assembly technology. Consequently, electrical circuit board assemblies fabricated according to the principles described herein can include acoustic elements with the desired dimensional characteristics and allow for convenient and repeatable assembly into headphones, such as earbuds, and other acoustic devices. Accordingly, more consistent acoustic performance may be achieved from the acoustic devices.

Examples disclosed herein are primarily directed to earbuds; however, it will be recognized that other types of headphones or other acoustic devices may be fabricated according to the principles described below.

FIG. 1 is a cross-sectional illustration of an example of a conventional feedback-based acoustic noise reduction (ANR) earbud 10. The ANR earbud 10 includes an earbud body 12 which may be formed from plastic or metal and includes a nominally conical section 14 shaped for insertion into the outer portion of the ear canal of a user. The remainder of the body 12 encloses a first acoustic chamber 16 and substantially encloses a second acoustic chamber 18. When worn, the second acoustic chamber 18 extends through the opening 20 in the conical section 14 and into the ear canal of the user. A wall 22 separates the internal volume of the earbud body 12 into the two acoustic chambers 16 and 18. A speaker 24 is disposed in the wall 22 (or defines part of the wall 22) and an acoustic noise reduction (ANR) microphone 26 is provided in the second acoustic chamber 18. As illustrated, two pairs of wires 28 and 30 extend through the earbud body 12: one pair 28 coupling the speaker 24 to an electrical audio signal source (not shown) and the second pair 30 coupling the ANR microphone 26 to ANR circuitry (not shown). In other instances, different numbers of wires may be used. For example, digital microphones may have electrical connections using three or more wires.

The wall 22 includes an acoustic port 32 that acoustically connects the first and second acoustic chambers 16 and 18. To fabricate the earbud 10, care must be taken to route the wires 28 and 30 though the earbud body 12 and through one or both acoustic chambers 16 and 18 to avoid damaging acoustic components. For example, the wires 16 and 18 must maintain reliable electrical connections with the speaker 24 and the ANR microphone 26, and avoid interfering with the acoustic port 32. Thus manufacture is generally labor intensive and take considerable time. U.S. Pat. No. 9,247,335 describes some of the difficulties in routing wires in conventional headphones, and proposes a solution so some of those difficulties; the problems in earbuds are typically similar if not greater. Earbud designs might also include other electrical devices, such as optical sources and sensors for heart rate monitoring, and/or accelerometers for fitness tracking functions. These electrical devices can also be present on the circuit board.

Figure 2:
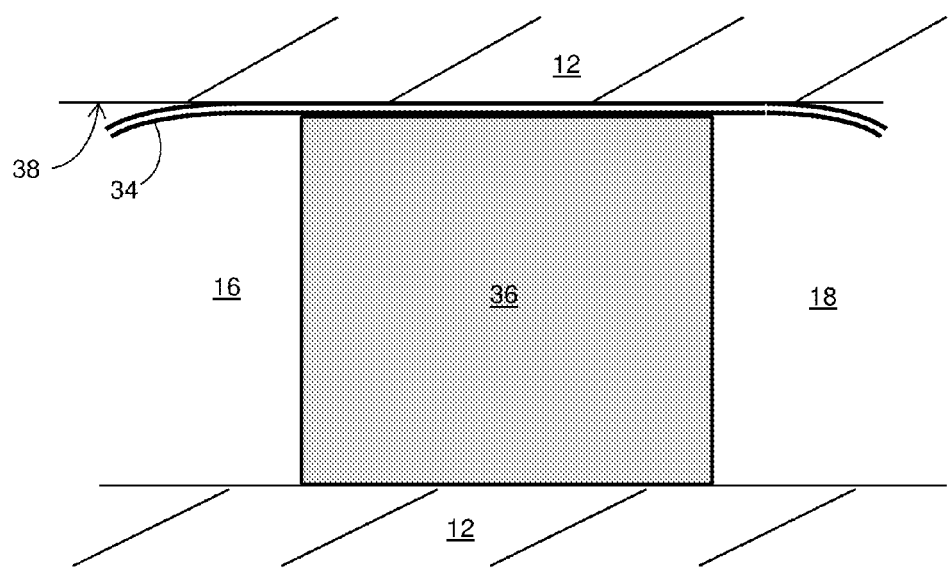
FIG. 2 is a cross-sectional depiction of a portion of an earbud that includes a flexible circuit board assembly.

FIG. 2 is a cross-sectional depiction of a portion of an earbud that includes a flexible circuit board assembly 34 (only a portion shown) according to principles described herein. In this example, a cylindrically-shaped speaker 36 acts as the wall 22 in FIG. 1 that separates the two acoustic chambers 16 and 18. The circuit board assembly 34 has a gradual curved shape along a portion of its length to conform to the space between the cylindrical speaker 36 and an adjacent portion of the inner wall 38 of the earbud body 12. A channel embedded within the circuit board assembly 34 includes an aperture at each end. One of the apertures is disposed within the first acoustic chamber 16 and the other aperture is disposed within the second acoustic chamber 18. The channel and apertures together define an acoustic channel that acoustically couples the two chambers 16 and 18 to each other.

Figure 3A:
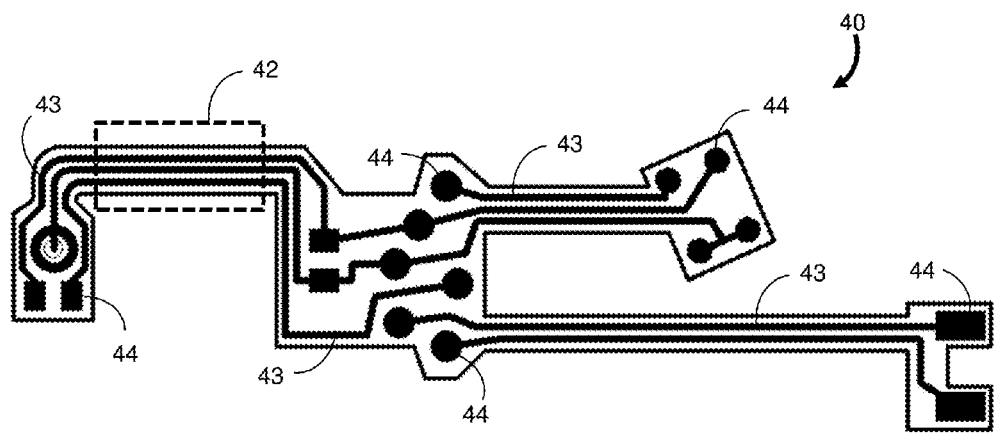
FIGS. 3A and 3B are a top-down view and a perspective view, respectively, of an example of a flexible electrical circuit board having an embedded acoustic channel.

FIG. 3A is a top-down view of an example of a flexible electrical circuit board 40 having an embedded acoustic channel. The circuit board 40 is unpopulated, that is, no electrical or acoustical components are mounted. The dashed rectangular box indicates a portion 42 of the circuit board 40 that includes the embedded acoustic channel that extends between the acoustic chambers. The circuit board 40 includes electrically conductive traces 43 (e.g., copper traces) on at least one surface that are used to electrically couple components mounted to the surface at mounting pads or solder pads 44.

Figure 3B:
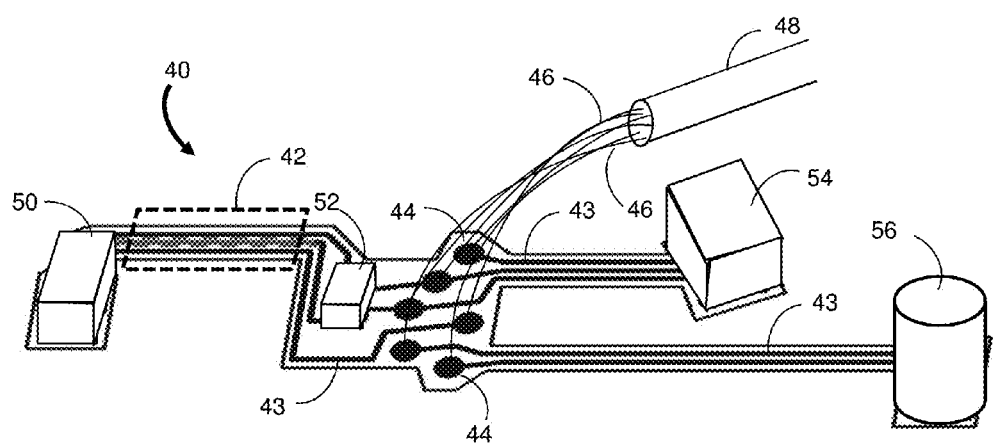

FIG. 3B is a perspective view of the flexible electrical circuit board 40 of FIG. 3A. Wires 46 extend from the end of a wiring harness 48 and are coupled to solder pads 44, for example, via solder. Components mounted to the circuit board 40 include a feedback microphone 50, an electrical component 52 (e.g., capacitor), a feed-forward microphone 54 and an acoustic driver 56 (e.g., earbud speaker). Although shown in a planar arrangement, it should be understood that the flexible circuit board 40 with its mounted components can be twisted into various shapes having one or more curved portions. For example and with additional reference to FIG. 2, the circuit board 40 can be twisted near one end so that the feedback microphone is located in the first acoustic chamber 16, the electrical component 52 and feed-forward microphone are located in the second acoustic chamber 18, and the acoustic driver 56 is positioned (in a similar way to speaker 36) to separate the two acoustic chambers 16 and 18 with the portion 42 located between the inside wall 38 of the earbud body 12 and the acoustic driver 56.

The acoustic channel has accurately-controlled dimensions to enable a predetermined acoustic tuning between the two acoustic chambers 16 and 18. Advantageously, the flexible nature of the electrical circuit board 40 enables the assembly time for an earbud to be reduced with an associated cost reduction, while a more consistent acoustic performance is achieved for earbuds fabricated to the same design because the fabricated channel maintains its dimensions when the circuit board is assembled to the earbud.

Figure 4A:
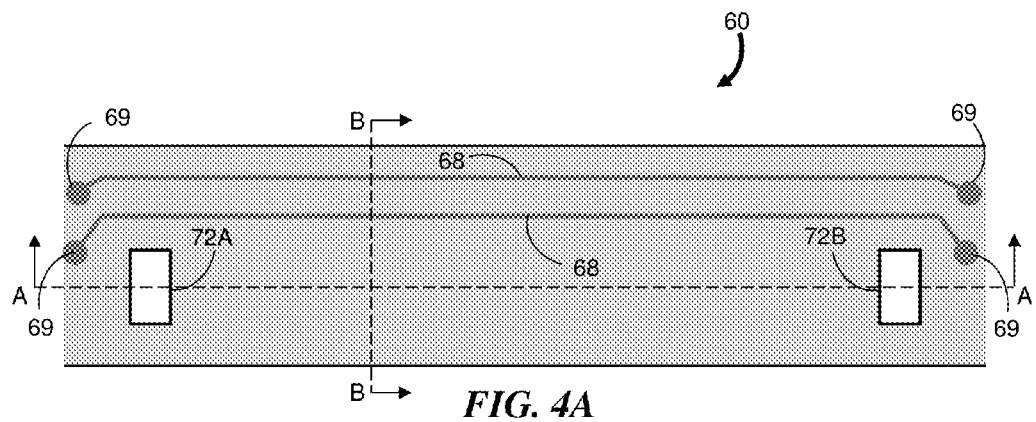
FIGS. 4A, 4B and 4C are simplified illustrations of a top view, cross-sectional side view and cross-sectional end view, respectively, of an example of an electrical circuit board having an acoustic channel.
Figure 4B:
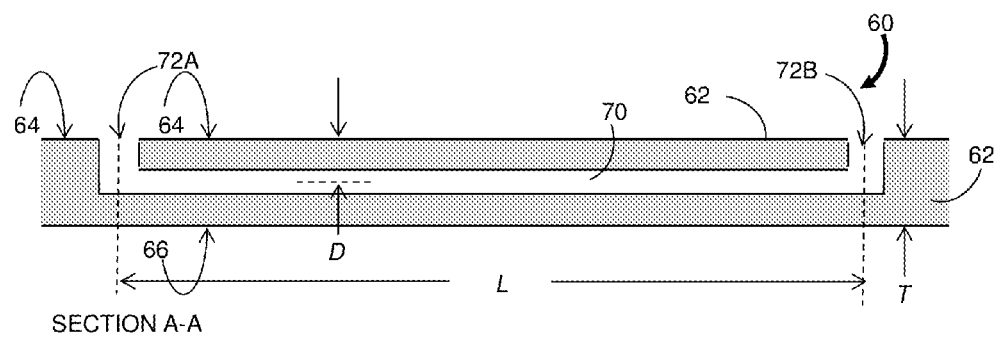
Figure 4C:
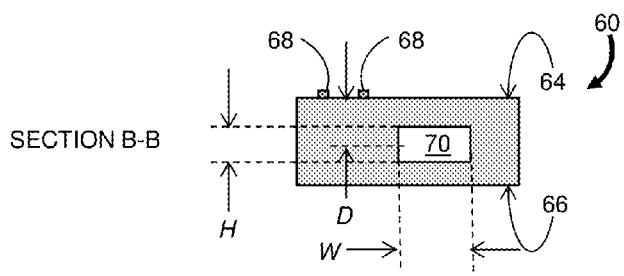

FIGS. 4A, 4B and 4C are simplified illustrations of a top view, cross-sectional side view and cross-sectional end view, respectively, of an example of an electrical circuit board 60 having an acoustic channel. The electrical circuit board 60 is formed of a flexible or rigid dielectric substrate 62 having an upper surface 64 and a lower surface 66 separated by a thickness T. As illustrated, the dielectric substrate 62 is a monolithic structure formed of a material having desired dielectric properties. For example, the material may be a polyimide, polyester, acrylic or epoxy. Electrically conductive traces 68 are formed on the upper surface 64. The traces 68 terminate at conductive pads 69 which may be used to electrically connect (e.g., via solder) to an electro-acoustic element or other device. Although only two substantially linear traces 68 are show, it will be appreciated that additional traces may be provided along the upper surface 64 and that the traces can have more complicated geometries. In other examples, one or more traces may be formed on the lower surface 66, or on both the upper and lower surfaces 64 and 66. In still other examples, traces may be formed inside (i.e., embedded within) the dielectric substrate below the upper surface 64 and above the lower surface 66.

In other examples, the dielectric substrate includes two or more distinct layers as described in more detail below. The layers may include one or more layers of dielectric material, one or more layers of conductive material (e.g., copper layers) and/or one or more layers of adhesive used to securely bond adjacent layers to each other.

Figure 4D:
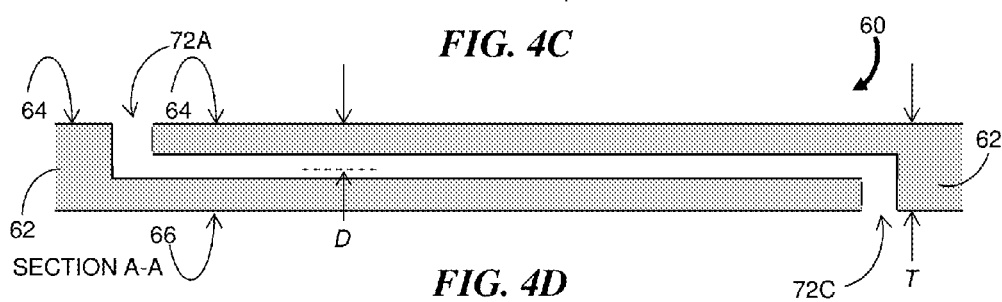
FIG. 4D shows an alternative configuration of the apertures shown in FIG. 4B.

The electrical circuit board 60 includes an acoustic channel embedded in the dielectric substrate 62. The acoustic channel includes a channel 70 disposed a distance D below the upper surface 64. The channel 70 extends along a length L between a first aperture 72A and a second aperture 72B which form the remainder of the acoustic channel. Each of the apertures extends down from the upper surface 64 to meet the respective end of the channel 70. FIG. 4D shows an alternative example in which one of the apertures 72C replaces the aperture 72B. In this alternative example, the aperture 72C open to the bottom surface 66 of the dielectric substrate.

The channel 70 has a width W and a height H which, together with the length L and dimensions of the two apertures 72 define the acoustic impedance of the acoustic channel. In the various examples described herein, the dimensions of the acoustic channel can be selected to achieve a desired tuning of the acoustic chambers in an earbud.

Figure 5A:
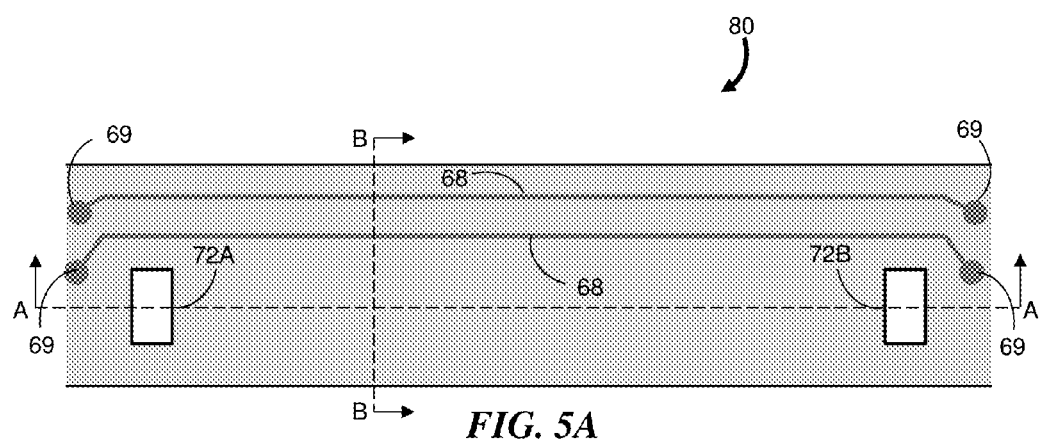
FIGS. 5A, 5B and 5C are illustrations of a top view, cross-sectional side view and cross-sectional end view, respectively, of another example of an electrical circuit board having an acoustic channel.
Figure 5B:
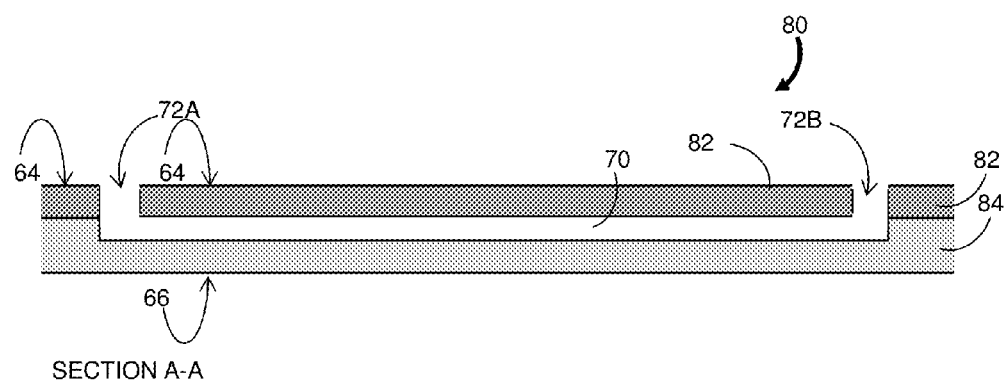
Figure 5C:
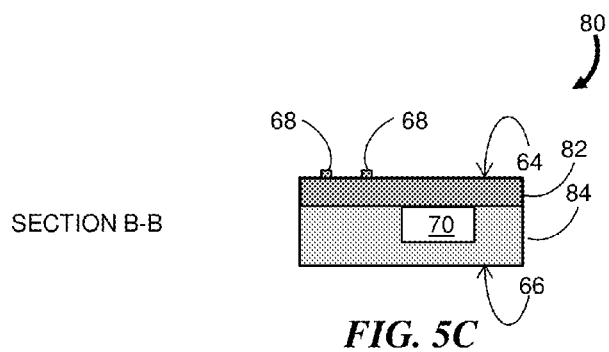

FIGS. 5A, 5B and 5C are illustrations of a top view, cross-sectional side view and cross-sectional end view, respectively, of another example of an electrical circuit board 80 having an acoustic channel. The electrical circuit board 80 is formed of a dielectric substrate having two layers 82 and 84. The channel 70 is formed by first forming a groove, or open channel, along a surface of the lower layer 84 that is opposite to the bottom surface 66. By way of example, a laser skiving process can be used to remove a portion of the thickness of the lower layer 64; however, the depth and topography of the resulting groove may be dependent on the homogeneity of the dielectric material. After forming the groove, the two layers 82 and 84 are then bonded together, for example, using an adhesive. Thus the top side of the channel 70 is defined by the inner surface of the upper layer 82 and the remaining three sides of the channel 70 are defined by the shape of the groove. If the lower layer 84 is a dielectric material, the upper layer 82 may be a dielectric layer, an insulating layer or a metallic layer.

In an alternative example, there is no upper layer 82. To form a channel that is closed except at its ends, a single layer or "block" of dielectric material having an open channel along a surface, i.e., a groove, may be bonded, or otherwise secured, to a surface of a separate structure such that surface of the separate structure forms the top of the channel. For example, the earbud body 12 may provide the top layer of the channel.

FIGS. 6A, 6B and 6C are illustrations of a top view, cross-sectional side view and cross-sectional end view, respectively, of another example of an electrical circuit board 90 having an acoustic channel. The electrical circuit board 90 is formed of a dielectric substrate having three layers: an upper layer 92, an intermediate layer 94 and a lower layer 96 which may be made of similar or different materials. Although not shown, an adhesive layer can be used between the upper and intermediate layers 92 and 94, and between the intermediate and lower layers 94 and 96. Although shown only on the upper surface 64, electrically conductive traces 68 may be provided on the lower surface 66 and/or on either or both surfaces of the intermediate layer 94.

Advantageously, the channel 70 may be formed by using a laser skiving process to remove material from the intermediate layer 94 prior to securing all the layers to each other to form a single structure. Laser skiving can be used to remove all the dielectric material in the intermediate layer 94 thereby allowing the thickness of the intermediate layer 94 to accurately define the height of the channel 70. The lower layer 96 may be a metallic layer and may be bonded to the intermediate layer 94 before initiating the skiving process.

This stops the skiving process at the boundary of the two layers 94 and 96 so that no material from the lower layer 94 is removed. In alternative examples, additional layers may be present below a metallic lower layer 96. In another alternative example, the intermediate layer 94 may be a bonding sheet disposed between the upper and lower layers 92 and 96. The bonding sheet is provided with a pre-cut portion (e.g., a rectangular opening) that forms an air gap in the multi-layer structure that defines the channel 70.

As described above, the height of the channel 70 is defined by the thickness of the intermediate layer 94. For example, a specific thickness of the intermediate layer may be chosen to achieve a desired channel height. By way of a non-limiting numerical example, the layer thicknesses for a flexible circuit board may be less than 10 μm to more than 30 μm. In some instances, masking may be used in the laser skiving process to accurately define the width of the material removed from the intermediate layer 94 and thereby limit the width of the channel 70.

The cross-sectional area of the channel 70 is determined by the channel width and the thickness of the intermediate layer 94. The cross-sectional shape of the channel 70 formed in this process is generally rectangular and, if the width is chosen and properly controlled to match the thickness of the intermediate layer 94, the shape of the cross-sectional area is a square which is a preferred rectangular shape for reducing acoustic loss. Preferably, the aspect ratio of the cross-sectional area is less than 10:1 to avoid significant loss. By way of non-limiting numerical examples, an acoustic channel embedded within an electrical circuit board can have a cross-sectional area with dimensions on the order of 0.1 mm$^2$ and may have a length of a few millimeters or greater.

Figure 7A:
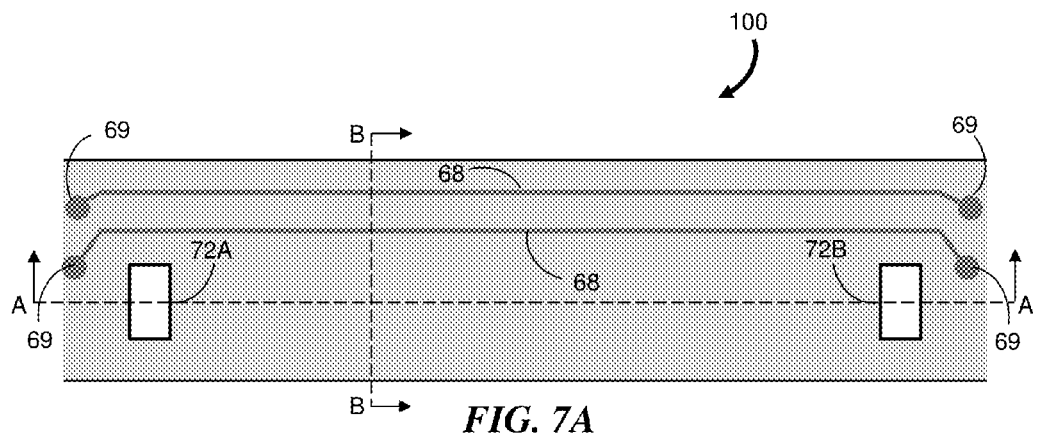
FIGS. 7A, 7B and 7C are illustrations of a top view, cross-sectional side view and cross-sectional end view, respectively, of still another example of an electrical circuit board having an acoustic channel.
Figure 7B:
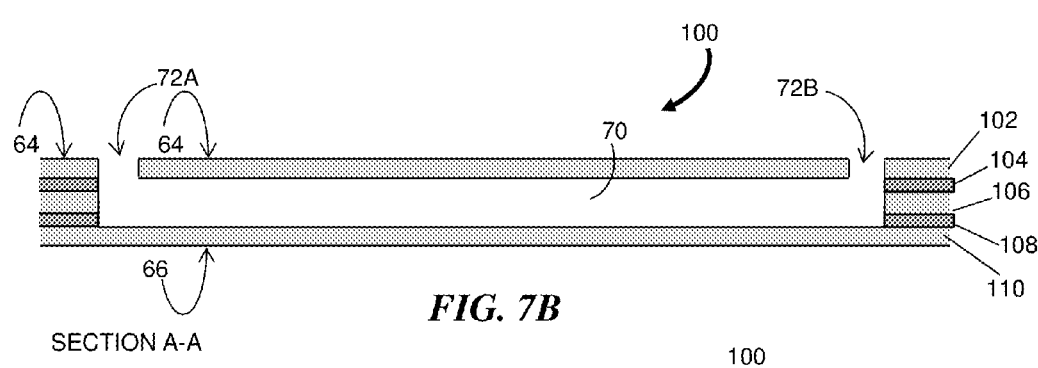
Figure 7C:
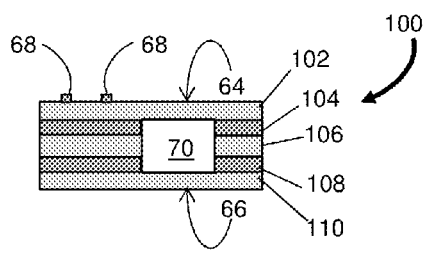

FIGS. 7A, 7B and 7C are illustrations of a top view, cross-sectional side view and cross-sectional end view, respectively, of another example of an electrical circuit board 100 having an acoustic channel. The electrical circuit board 100 is formed of a dielectric substrate having five layers 102, 104, 106, 108 and 110. The three intermediate layers 104, 106 and 108 can be processed (e.g., laser skiving) to yield a desired channel height through addition of their individual layer thicknesses. The height of the channel 70 may be controlled to the level of the thinnest available layer for the intermediate layers 104, 106 and 108.

Figure 7D:
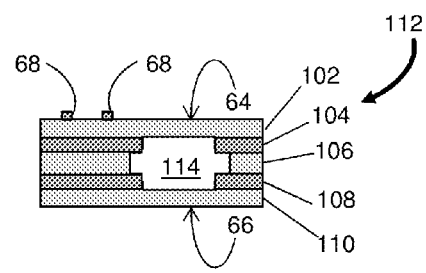
FIG. 7D shows an alternative structural configuration with respect to the cross-sectional view shown in FIG. 7C.

FIG. 7D shows an alternative example in which two of the intermediate layers 104 and 108 each provide a same channel width contribution to a channel 114 whereas intermediate layer 106 provides a greater channel width contribution. Consequently, by forming the channel 114 in multiple intermediate layers, the cross-sectional shape of the channel 114 is not limited to a rectangular shape. The use of even more intermediate layers allows more complicated cross-sectional shapes (e.g., generally elliptical or circular) to be realized; however, the total number of layers can be limited by the thicknesses of the individual layers, acceptable reduction in flexibility, total cross-sectional dimensions and fabrication time and costs.

In the above examples, the cross-sectional area of the channel is constant along its length; however, an acoustic channel can be formed with a cross-sectional area that varies along the length of the channel. The variation in cross-sectional area with length may be used to control acoustic performance at different acoustic frequencies. A variation in cross-sectional area can be achieved, for example, by a changing width in one or more intermediate layers along the channel length and/or a changing channel height along the channel length. For example, the height of the channel 70 shown in FIGS. 7B and 7C varies along the channel length if the length of the openings in at least two intermediate layers is different.

The channel structure can vary from the single linear channel configuration described above. For example, the channel may be curved. Alternatively, two or more channels may be formed in the circuit board. Multiple channels may be arranged in parallel and/or may have different cross-sectional dimensions and/or lengths.

A number of implementations have been described. Nevertheless, it will be understood that the foregoing description is intended to illustrate, and not to limit, the scope of the inventive concepts which are defined by the scope of the claims. Other examples are within the scope of the following claims.

What is claimed is:

1. A headphone comprising:
an earbud body having an internal volume comprising a first acoustic chamber and a second acoustic chamber;
an acoustic element disposed in the internal volume between the first acoustic chamber and the second acoustic chamber; and
a dielectric substrate disposed in the internal volume and having a length extending from a first end in the first acoustic chamber to a second end in the second acoustic chamber, the dielectric substrate comprising an upper surface, a lower surface and a channel disposed between the upper and lower surfaces, the dielectric substrate having a first aperture and a second aperture each extending into a thickness of the substrate from one of the upper and lower surfaces, the channel extending from a first channel end at the first aperture to a second channel end at the second aperture, the first and second apertures being disposed within and opening into the first and second acoustic chambers, respectively, the channel and the first and second apertures defining an acoustic channel between the first and second acoustic chambers that acoustically couples the first and second acoustic chambers to each other.

2. The headphone of claim 1 wherein the dielectric substrate is a flexible dielectric substrate.

3. The headphone of claim 1 wherein the dielectric substrate is a rigid dielectric substrate.

4. The headphone of claim 1 wherein the dielectric substrate comprises an upper layer, a lower layer and an intermediate layer disposed between the upper and lower layers, and wherein the channel is formed in the intermediate layer.

5. The headphone of claim 4 further comprising a first adhesive layer disposed between the upper layer and the intermediate layer, and a second adhesive layer disposed between the intermediate layer and the lower layer.

6. The headphone of claim 1 wherein the dielectric substrate comprises a first layer adjacent to a second layer and wherein the channel is disposed along a surface of the first layer that is adjacent to a surface of the second layer.

7. The headphone of claim 6 wherein one of the first and second layers is one of a metallic layer, a bonding sheet, an insulating layer and a stiffener layer.

8. The headphone of claim 6 further comprising an adhesive layer disposed between the first and second layers.

9. The headphone of claim 1 wherein the channel has a square cross-section.

10. The headphone of claim 4 wherein at least one of the upper layer, the lower layer and the intermediate layer is at least one of a metallic layer, a bonding sheet, a stiffener layer and an adhesive layer.

11. The headphone of claim 4 wherein the dielectric substrate comprises a plurality of intermediate layers and wherein the channel is formed in at least two of the intermediate layers.

12. The headphone of claim 11 wherein the channel has a generally elliptical cross-section.

13. The headphone of claim 1 further comprising at least one electrical trace formed on at least one of the upper surface and the lower surface.

14. The headphone of claim 4 wherein the intermediate layer comprises a pair of intermediate layer surfaces and further comprising an electrical trace formed on at least one of the intermediate layer surfaces.

15. The headphone of claim 1 wherein the channel has a square cross-section.

16. The headphone of claim 4 wherein at least one of the upper layer, the lower layer and the intermediate layer is at least one of a metallic layer, a bonding sheet, a stiffener layer and an adhesive layer.

17. The headphone of claim 4 wherein the dielectric substrate comprises a plurality of intermediate layers and wherein the channel is formed in at least two of the intermediate layers.

18. The headphone of claim 17 wherein the channel has a generally elliptical cross-section.

* * * * *